(12) United States Patent
Ramm et al.

(10) Patent No.: US 9,997,338 B2
(45) Date of Patent: Jun. 12, 2018

(54) METHOD FOR OPERATING A PULSED ARC SOURCE

(75) Inventors: Jürgen Ramm, Maienfeld (CH); Oliver Gstoehl, Balzers (LI); Beno Widrig, Bad Ragaz (CH); Daniel Lendi, Grabs (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 1599 days.

(21) Appl. No.: 11/102,337

(22) Filed: Apr. 8, 2005

(65) Prior Publication Data

US 2007/0000772 A1    Jan. 4, 2007

(30) Foreign Application Priority Data

Mar. 24, 2005 (CH) ........................................ 518/05

(51) Int. Cl.
*C23C 14/00* (2006.01)
*H01J 37/34* (2006.01)
*C23C 14/02* (2006.01)
*C23C 14/06* (2006.01)
*C23C 14/08* (2006.01)
*C23C 14/32* (2006.01)
(Continued)

(52) U.S. Cl.
CPC ........ *H01J 37/3444* (2013.01); *C23C 14/024* (2013.01); *C23C 14/0641* (2013.01); *C23C 14/08* (2013.01); *C23C 14/081* (2013.01); *C23C 14/083* (2013.01); *C23C 14/325* (2013.01); *F01D 5/288* (2013.01); *H01J 37/32055* (2013.01); *H01J 37/34* (2013.01); *F05D 2230/313* (2013.01)

(58) Field of Classification Search
CPC ..................................................... C23C 14/325
USPC ...................................... 204/192.38, 298.41
See application file for complete search history.

(56) References Cited

U.S. PATENT DOCUMENTS 3,793,179 A * 2/1974 Sablev et al. ............. 204/298.41
4,645,895 A   2/1987 Boxman et al.
(Continued)

FOREIGN PATENT DOCUMENTS

DE          4401986 A1    7/1995
DE          10010126 A1   9/2001
(Continued)

OTHER PUBLICATIONS

Machine Translation of Grimm( EP 0666355 as cited on IDS), published on Aug. 9, 1995.*

(Continued)

*Primary Examiner* — John J Brayton
(74) *Attorney, Agent, or Firm* — Pearne & Gordon LLP

(57) ABSTRACT

This invention relates to an arc-based method for the deposition of insulating layers and to an arc-based method for low-temperature coating processes, in which an electric arc discharge, ignited and applied on the surface of a target in an arc source, is simultaneously fed a direct current and a pulsed or alternating current.
The invention further relates to an arc source in which the target is connected to a power supply unit that encompasses either a minimum of one pulsed high-current power supply 18, 18' and an additional power supply 13', 18", or a power supply 21, 21', 22 designed with switchable combinatorial circuitry.

36 Claims, 10 Drawing Sheets

(51) Int. Cl.
*F01D 5/28* (2006.01)
*H01J 37/32* (2006.01)

(56) References Cited

U.S. PATENT DOCUMENTS

| | | | | |
|---|---|---|---|---|
| 4,919,968 | A | * | 4/1990 | Buhl et al. ............... 427/580 |
| 5,009,922 | A | * | 4/1991 | Harano ............. C03C 17/245 |
| | | | | 204/192.29 |
| 5,507,930 | A | * | 4/1996 | Yamashita et al. ...... 204/192.15 |
| 5,518,597 | A | | 5/1996 | Storer et al. |
| 5,552,674 | A | * | 9/1996 | George et al. ............. 315/82 |
| 6,033,768 | A | * | 3/2000 | Muenz et al. ............. 428/216 |
| 6,361,663 | B1 | | 3/2002 | Berthold et al. |
| 6,440,281 | B1 | * | 8/2002 | Sturmer et al. ......... 204/298.08 |
| 6,517,688 | B2 | * | 2/2003 | Sakurai et al. ......... 204/192.35 |
| 6,551,722 | B2 | * | 4/2003 | Jonte et al. ............. 428/687 |
| 6,602,390 | B1 | | 8/2003 | Brandle et al. |
| 6,936,145 | B2 | * | 8/2005 | Sunthankar et al. .... 204/298.41 |
| 2002/0139658 | A1 | * | 10/2002 | Kanakasabapathy et al. ............. 204/164 |
| 2002/0144656 | A1 | * | 10/2002 | Yoshikawa et al. ......... 118/718 |
| 2003/0077914 | A1 | * | 4/2003 | Le et al. ............. 438/763 |
| 2003/0209424 | A1 | | 11/2003 | Brandle et al. |
| 2003/0234176 | A1 | * | 12/2003 | Haidar ............. 204/192.38 |
| 2004/0026235 | A1 | * | 2/2004 | Stowell, Jr. ......... 204/192.12 |
| 2004/0038033 | A1 | * | 2/2004 | Messier et al. ......... 428/408 |

FOREIGN PATENT DOCUMENTS

| | | |
|---|---|---|
| EP | 0462303 A1 | 12/1991 |
| EP | 0666335 A1 | 8/1995 |
| JP | 01042574 A | 2/1989 |
| WO | 02/070776 | 9/2002 |
| WO | 02070776 A1 | 9/2002 |
| WO | 03/057939 | 7/2003 |

OTHER PUBLICATIONS

Translation to Grimm DE 0666335 published Aug. 1995.*
International Search Report for Counterpart Application PCT/CH2006/000123 dated Sep. 25, 2007.
Chinese Office action for Application No. 200680009506.2 dated Sep. 11, 2009.

* cited by examiner

FIG. 10

| Target Typ, Mode | | Al, DC | | Al, DC-gepulst | | Cr, DC | | Cr, DC-gepulst | | Ti, DC | | Ti, DC-gepulst | |
|---|---|---|---|---|---|---|---|---|---|---|---|---|---|
| I-DC/I-pulsed DC [A] | | 100/0 | | 100/150 | | 100/0 | | 100/150 | | 100/0 | | 100/150 | |
| U-Pulsquelle [V] | | -- | | 250 | | -- | | 250 | | -- | | 250 | |
| Pulsbreite on/off [µs] | | -- | | 10/10 | | -- | | 10/10 | | -- | | 10/10 | |
| Temperatur [°C] | | 400 | | 400 | | 400 | | 400 | | 400 | | 400 | |
| Oxidische Schichten | | | | | | | | | | | | | |
| Nr | Gas-Fluss [sccm] | U-DC-Qu. [V] | p [mbar] | U-DC-Qu. [V] | p [mbar] | U-DC-Qu. [V] | p [mbar] | U-DC-Qu. [V] | p [mbar] | U-DC-Qu. [V] | p [mbar] | U-DC-Qu. [V] | p [mbar] |
| 2 | O2 = 0 / Ar = 100 | 22.4 | 3.40E-03 | 23.2 | 3.00E-03 | 28 | 3.40E-03 | -- | -- | 24.2 | 3.40E-03 | -- | -- |
| 3 | O2 = 200 / Ar = 100 | 28.6 | 8.00E-03 | -- | -- | 37.4 | 7.80E-03 | -- | -- | 33 | 8.20E-03 | -- | -- |
| 4 | O2 = 400 / Ar = 100 | 34.4 | 1.30E-02 | -- | -- | 41 | 1.20E-02 | -- | -- | 36.1 | 1.30E-02 | -- | -- |
| 5 | O2 = 200 / Ar = 50 | 29 | | -- | -- | -- | | -- | -- | -- | | -- | -- |
| 6 | O2 = 200 / Ar = 0 | 31.7 | 5.00E-03 | 29.3 | 4.40E-03 | 36.3 | | 32 | 3.40E-03 | 35.8 | 5.10E-03 | 30.1 | |
| 7 | O2 = 400 / Ar = 0 | 34.4 | | 33.2 | 9.00E-03 | 38 | | 31 | 9.00E-03 | 36.5 | | 28.4 | |
| Nitridische Schichten | | | | | | | | | | | | | |
| Nr | Gas-Fluss [sccm] | U-DC-Qu. [V] | p [mbar] | U-DC-Qu. [V] | p [mbar] | U-DC-Qu. [V] | p [mbar] | U-DC-Qu. [V] | p [mbar] | U-DC-Qu. [V] | p [mbar] | U-DC-Qu. [V] | p [mbar] |
| 8 | N2 = 0 / Ar = 100 | 22 | 3.40E-03 | -- | -- | 24 | 3.40E-03 | -- | -- | 23.6 | 3.80E-03 | -- | -- |
| 9 | N2 = 200 / Ar = 100 | 26 | 8.00E-03 | -- | -- | 28.5 | 7.80E-03 | -- | -- | 28.6 | 8.20E-03 | -- | -- |
| 10 | N2 = 400 / Ar = 100 | 25.5 | 1.30E-02 | -- | -- | 28 | 1.20E-02 | -- | -- | 27.2 | 1.30E-02 | -- | -- |
| 11 | N2 = 200 / Ar = 0 | 27 | 5.00E-03 | 26.4 | 4.70E-03 | 27.6 | 5.20E-03 | 26.8 | 5.00E-03 | 27.3 | 5.10E-03 | 26.7 | 4.70E-03 |
| 12 | N2 = 400 / Ar = 0 | 27.5 | 1.00E-02 | 27 | 1.00E-02 | 28 | 1.00E-02 | 27 | 1.00E-02 | 27.7 | 1.00E-02 | 26.6 | 1.00E-02 |

METHOD FOR OPERATING A PULSED ARC SOURCE

TECHNICAL DOMAIN

This invention relates to a method for operating an arc source and to an arc source.

PRIOR ART

Prior art has employed pulsed arc sources for some time. WO 02/070776, for example, describes in a very general way the use of a pulsed arc for cutting super-hard TiSiN layers, among others.

WO 03/057939 describes an arc source in which the arc is ignited via a pulsed high-voltage power supply and the arc is then fed by a pulsed high-current power supply. The arc is operated in discontinuous fashion. The base materials are metallic conductive cathodes, conductive alloys and, additionally, carbon or, alternatively, vaporizable semiconductors. However, the arc source described, employing a target body with a very complex geometry, is expensive to make especially when difficult-to-cut cathode materials are used, and its operation is costly.

U.S. Pat. No. 6,361,663 describes an arc source with a cathode of an electrically conductive material that is pulsed, or pulsed in modulated fashion, with peak currents of up to 5 kA and a base current for instance of 100 A. That source as well, configured with a magnetic tunnel and an anode that is completely surrounded by the cathode, is expensive to produce and to operate.

Depositing electrically insulating layers by cathodic arc vaporization is a known technique. U.S. Pat. No. 5,518,597 for one describes the production of such layers in a reactive process whereby the surfaces to be coated are placed outside a visual connecting line to the active target surface which in this case is utilized in a manner analogous to the vaporization surface of the cathode. After the pump-down the process pressure is established with an inert gas. During the coating process the oxygen is introduced in direct proximity to the surface to be coated, at a rate low enough to allow its consumption during the operation while the pressure is maintained at a steady level. This approach is consistent with the theory expressed in other prior-art documents, whereby it is important to introduce the reactive gas close to the substrate so as to reduce target oxidation and to stabilize the arc discharge. As an additional measure designed to prevent the undesirable generation of insulating layers on the anode, U.S. Pat. No. 5,518,597 provides for the anode to be kept at a temperature of preferably around 1200° C., meaning that it must be made from an expensive refractory metal.

What these processes have in common is that the use of reactive gases causes the latter to react with the vaporized material or materials, which quickly leads to the formation of an insulating layer, requiring special measures that prevent contamination of the active target or anode surface as well as the formation of undesirable droplets. Such measures include not only the aforementioned heating of the anode and the feed-in and precise metering of the reactive gas directly next to the surface to be coated, but also a dilution of the reactive gas with a high percentage of inert gas.

Particular care must be taken to ensure that the target surface retain its bare-metal character or at least a level of conductivity corresponding to that of a semiconductor. While the positive temperature gradient of semiconductors provides sufficiently good conductivity in the area of the arc spot to allow the arc to burn, the concomitant, increased tendency of the arc to stick usually leads to a higher level of spattering than would be the case with conductive metal target surfaces. Here as well, prior art has developed a number of remedies. For example, as mentioned above, the source can be positioned outside the optical connecting path to the target surface, which, however, drastically reduces the yield of the target material and the deposition rate. Magnetic fields can be applied in addition or by themselves, designed to guide only the ionized vapor component to the object surface while electrically neutral droplets are intercepted by baffle plates. Examples include curved magnetic filters, magnetic lenses and similar devices.

Another spatter-reducing method involves a brief interruption of the power feed and the reignition of the arc at a different spot of the active target surface, for instance under laser beam control. This method is employed especially in the realm of cathodic arc vaporization of carbon, but also for metal alloys.

The common denominator for all these methods, and their equally well-known combinations, is significant additional technical complexity and/or a substantial reduction of the deposition rate. And yet, if an insulating layer forms on the target surface, even these measures have not so far produced a stable process.

DESCRIPTION OF THE INVENTION

It is therefore one objective of this invention to introduce a method by which insulating layers can be produced even with regular arc sources without additional, complex measures and under stable process conditions.

According to a surprising discovery, obtaining a stable arc process is possible even when the target surface is at least partly covered with an insulating layer, by simultaneously applying a direct current superimposed by a pulsed or alternating current.

For example, an aluminum target was operated for several hours in a pure oxygen atmosphere without requiring any additional provisions. A voltage increase at the target was observed but it stabilized within minutes and did not lead to an interruption or to an unstable arc process. Compared to a metallic aluminum layer deposited under identical conditions, the aluminum oxide layer deposited on the substrate positioned directly in front of the target revealed an altogether unexpected reduction of surface defects caused by adhering droplets. Similar results were obtained with chromium and titanium targets as well as metallic targets consisting of these materials with a high silicon concentration even in excess of 50%, in a pure oxygen or pure nitrogen atmosphere. In all cases it was possible after a complete insulating surface coating and even after process interruptions to easily reignite the targets in a reactive-gas atmosphere and to continue operation with reduced droplet formation. In this pulsed mode, operation in a pure reactive-gas atmosphere, with the target surface coated as a result of the reactive gas and its reaction with the target surface, produced an improved layer quality with reduced droplet formation.

Compared to target operation without an insulating coating, it was found that the proportion of reactive gas should be at least high enough to cause the source voltage to increase by not less than 10% and preferably by at least 20% as compared to operation without an insulating coating [sic]. The augmentation of the source voltage is in all cases a function of the reactive gas used and of the target material. The higher the insulating capacity of the compound produced from the target material and the reactive gas on the target surface, the greater the difference in the source voltage will usually be, although numerous surface- and material-specific reaction patterns and inhibitions make it difficult to establish a direct mathematical correlation.

Examples of suitable reactive gases include the following: Oxygen, nitrogen, acetylene, methane, silanes such as tetramethyl silane, trimethyl aluminum, diborane and in general all gases containing oxygen, nitrogen, silicon, boron or carbon. This method lends itself particularly well to processes involving a high reactive gas flux rate and in which the amount of reactive gas selected is greater than that of the inert gas, for instance over 70% and especially more than 90%. However, as mentioned above, processes run in a pure i.e. 100% reactive gas atmosphere will do very well.

Eligible target materials generally include all and any materials which in interaction with the aforementioned gases generate on a target, operated as described, a corresponding insulating layer consisting for instance of an oxide, nitride, boride, silicide, carbide or a mixture of these compounds. But hard coatings, barrier layers and decorative coatings are best produced using the following materials: Transition metals of the periodic-table subgroups IV, V, VI, or aluminum, boron, carbon or silicon, or an alloy or compound of these materials such as TiAl, CrAl, TiAlCr, TiSi, TaSi, NbSi, CrSi, WC. Even pure materials with a high melting point such as W, Ta, Nb and Mo are more easily vaporized by this method.

For a further reduction of spattering, especially during the operation of a target in an oxygen-containing atmosphere, it may be desirable, as disclosed in U.S. Pat. No. 6,602,390, to use a target material that consists of a single crystallographic phase.

As another advantage, the simultaneous operation of an arc source with a direct current and a pulsed or alternating current lends itself to the coating of temperature-sensitive work pieces consisting for instance of hardened or tempered steels, aged bronze- and brass-based alloys, aluminum-magnesium alloys, synthetic materials, and others. While in a DC operation of one or several arc sources near holding current—the lowest current at which stable operation of an electrically conductive arc source with a simple DC power supply is still possible—the thermal stress on the object work pieces to be coated is low enough, the deposition rate is scarcely satisfactory for industrial applications. The level of the holding current or holding power is determined by the target material, the configuration of the arc source and the operation of the arc discharge, for instance whether the latter takes place in a vacuum with or without the addition of an inert or reactive gas. Adequate conductivity for ensuring stable operation at low currents is offered for instance by bare metal surfaces, but such compounds as WC, TiN or CrN, graphite and silicon targets are border-line cases in that, while their conductivity is still sufficient to permit vaporization by a DC arc, they reveal a strong local burn-in tendency of the arc, resulting in plasma fluctuations and substantial droplet formation, which is why nowadays graphite targets are preferably operated in the pulsed mode.

On the other hand, when a source is operated at near-DC holding current with the simultaneous superposition of a pulsed current it is possible, as was discovered by surprise, not only to substantially increase the deposition rate but also, when compared to a DC coating produced at a similar rate, to keep thermal stress at a low level. In this case it is desirable to set the DC component at 100 to 300% and preferably between 100 and 200% of the holding current or holding power.

In the arc sources described in detail further below, that percentage of the holding current corresponds to a DC component of the current flow in a range between 30 and 90 A and preferably between 30 and 60 A. That allows the arc source to be operated essentially without a process gas, but preferably with a process gas containing only a reactive gas, or only an inert gas, or a reactive and inert gas mixture.

The target material may be essentially any conductive or semiconductive material but preferably one of those mentioned above.

The different current components can be generated and applied in conventional fashion. For example, the direct-current component can be produced by a DC generator, the pulsed or alternating current component by a pulsed or alternating current generator, with both generators either parallel- or series-connected between the arc source and at least one anode or ground.

As another possibility, the direct current and pulsed current components can be generated by two pulsed or alternating current generators connected as stated and operated in a superpositioned, synchronized mode. And finally it is possible to generate the direct current and pulsed current components by means of one single current generator clocked in secondary or primary fashion.

This method is of particular interest for industrial applications for instance when work pieces that have to meet special requirements in terms of wear resistance are to be coated, or work pieces with insulating or decorative surface properties. Examples of coatings that are particularly suitable for use with these methods include aluminum oxide, aluminum nitride, aluminum oxinitride, chromium oxide, chromium nitride, chromoxinitride, aluminum-chrome oxide, aluminum-chrome nitride, aluminum-chromoxinitride, aluminum-chromoxicarbonitride, silicon oxide, silicon nitride, silicon oxinitride, silicon-aluminum oxide, silicon-aluminum nitride, silicon-aluminum oxinitride, titanium-silicon nitride, titanium-silicon oxinitride, tantalum-silicon nitride, tantalum oxide, tantalum oxinitride, tungsten-silicon nitride, niobium-silicon nitride, titanium carbide, tungsten carbide, tungsten-silicon carbide, and alloys or compounds of the materials listed above.

These materials can be deposited as single layers or as a sequence of two or more layers varied on the basis of their elemental composition, their stoichiometry or their crystallographic orientation, the thickness of the individual layers being selectable as needed between a few nanometers and several micrometers. Moreover, as those skilled in the art know, it is possible to deposit from various compounds, prior to the above-mentioned layers, for instance metal or nitride bonding or adaptive layers serving such purposes as providing a progressive transition from the substrate material of the work piece to the coating material. Traditional bonding layers consist for instance of Cr, Ti, CrN or TiN. Adaptive layers are described in Example 1 below.

These methods can be further enhanced by applying a DC, pulsed- or alternating-current bias which, if necessary, can be synchronized with the pulsed or alternating current generator of the source.

Using a conventional approach, at least one inert gas and at least one reactive gas or at least two reactive gases can be injected in alternating fashion perpendicular to the work-piece surface to modify the layer composition, permitting the deposition of dual- or multilayer systems with a gradual or stepped progression of the layer constituents. This can be accomplished by means of several sources using identical or different target materials.

With a similarly advantageous effect, one of the procedures described above can serve to operate an arc source when a source is used to etch work-piece surfaces, since this process causes a substantially lower droplet formation on the surface than is the case with metallic target surfaces. Here as well a DC, pulsed or alternating-current bias is applied on the work piece, albeit much higher in most cases than the bias applied in a coating process. For example, substrate voltages can be selected at between −50 and −2000 V and preferably at between −200 and −1500 V. The ablation effect of the etching can be intensified by the addition of an etching gas containing for instance the following components: He, Ar, Kr, oxygen, nitrogen, hydrogen, a halogen (e.g. chlorine, fluorine, bromine, iodine) or a halogenous compound.

In all of the procedures described above the deposition rate or energy injection into the work piece can be selected and controlled by appropriately adjusting the pulse width, the current pulse, the pulse height or the pulse-width repetition rate or by a combination of these parameters. Another possibility consists in increasing the DC source current, which, however, does not lend itself well for instance to low-temperature processes.

Work-piece objects eligible for such a coating or etching process include in particular tools and components made from steels and structural metals such as copper bronze and lead bronze, brass and special alloys such as AlMg alloys and hard metals, from ceramic materials such as boron nitride and especially CBN, ceramic-metal compounds, and corresponding objects provided with at least partly diamond-tipped or ceramic surfaces.

Another area in which these processes can be applied is the coating of work pieces consisting of silicon or other semiconductive materials.

It has been found that coating in the pulsed mode described is also suitable for insulating substrates where a DC substrate bias or a pulsed DC substrate bias at low or moderate frequencies would not be practical.

Additional desirable effects obtainable with a method as described above can be summarized in a few words as follows:

1. A stable process for producing insulating layers by means of arc vaporization without spatter that would inhibit through-oxidation/reaction of the layer.
2. It is possible for the first time ever to work with a completely contaminated arc target. The reactivity, i.e. the supply of the reactive component such as oxygen in the deposition of aluminum oxide, can be augmented when working in the fully contaminated mode and in a pure reactive gas atmosphere while at the same time enhanced layer growth is attainable.
3. It is not necessary to provide a local or pressure-stage separation of the target and the reaction area nor any complex separation of spatter from ionized vapor.
4. The directional arc control requires no added magnetic field support.
5. The extent and size of spatter are reduced even when using a contaminated target.
6. Modulated pulse operation permits the use of higher currents, resulting in enhanced ionization at identical or even lower thermal stress levels of the target.
7. Carbon and semiconductive materials can be vaporized virtually spatter-free without reignition and complex directional arc control.
8. Conductive, semiconductive and nonconductive target surfaces are more evenly ablated.
9. A more finely divided arc, i.e. many small arc spots rapidly moving across the surface.
10. The attainment of higher ionization by applying high-current pulses with an attendant augmentation of the substrate current.
11. The process control in reactive arc vaporization no longer depends on the target coating with insulating or conductive layers, thus permitting reactive-gas mixtures as well as ramping during reactive processes, an advantage for both the intermediate layer and the functional layer.
12. Improved process stability and a wider process window.
13. The employability of standard power supplies permitting a wide range of current and voltage specifications (and thus a variety of economical combinations, including for instance an inexpensive DC power supply for base loads).
14. The invention ensures that the plasma will not be interrupted, thus obviating the need to repeatedly or periodically reignite it by means of correspondingly complex equipment.
15. This method permits combinations with additional plasma sources. In this connection, particular mention should be made of an additional excitation through a concurrently operated low-voltage arc, resulting in a further augmentation of the reactivity during the layer deposition on the substrate.

WAYS TO IMPLEMENT THE INVENTION

The following illustrates a typical progression of a coating procedure according to the invention in a reactive arc coating process. This was how, in an industrial Balzers type RCS coating system as depicted for instance in EP 1 186 681, FIGS. 3 to 6, description column 7 line 18 to column 9 line 25, aluminum oxide was deposited on different work pieces along the example described in detail below.

Apart from the coating process itself, brief mention will be made, where necessary, of additional procedural steps relating to additional pre- and post-processing of the substrates. As those skilled in the art are aware, many of these steps, such as the cleaning of the substrates which differs depending on the material used and on the preprocessing performed, leave room for a wide range of variations whereby, under certain conditions, some can be omitted, shortened, extended or combined in other ways.

EXAMPLE #1

After placing the work pieces in the appropriate double- or triple-rotatable holders and the holders in the vacuum processing system, the processing chamber was pumped down to a pressure of about $10^{-4}$.

For setting the process temperature a low-voltage arc (LVA) plasma, aided by radiation heaters, was ignited between a cathode chamber with a hot cathode, separated by a baffle, and the anodic work pieces in an argon-hydrogen atmosphere.

The heating parameters were selected as follows:

| | |
|---|---|
| Discharge current, LVA | 150 A |
| Argon flow | 50 ccm/s |
| Hydrogen flow | 300 ccm/s |
| Process pressure | $1.4 \times 10^{-2}$ mbar |
| Substrate temperature | approx. 500° C. |
| Process duration | 45 min. |

Those skilled in the art are familiar with alternative parameters. The substrates were preferably used as anodes for the low-voltage arc and also preferably pulsed in a unipolar or bipolar mode.

As the next procedural step the etching was started. To that end the low-voltage arc was operated between the filament and the auxiliary anode. Here as well, a DC-, pulsed-DC or AC-operated MF or RF supply can be connected between the work pieces and ground. As a matter of preference, however, the work pieces were fed a negative bias voltage.

The etching parameters were selected as follows:

| | |
|---|---|
| Argon flow | 60 ccm/s |
| Process pressure | $2.4 \times 10^{-3}$ mbar |
| Discharge current, LVA | 150 A |
| Substrate temperature | approx. 500° C. |
| Process duration | 30 min. |

To ensure a stable low-voltage arc discharge during the production of insulating layers, all LVA-aided procedural steps involved the use of either a hot, conductive auxiliary anode or a pulsed high-current supply connected between the auxiliary anode and ground.

To increase the bonding strength a CrN layer about 300 nm thick was applied through arc vaporization which, if additional ionization is needed, can be further assisted by the plasma of the low-voltage arc.

The parameters for the intermediate layer were selected as follows:

| | |
|---|---|
| Argon flow | 80 ccm/s |
| Nitrogen flow | 200 ccm/s |
| Process pressure | $8 \times 10^{-3}$ mbar |
| DC source current Cr | 140 A |
| Substrate bias | from −100 V to −40 V bipolar 36 μs negative and 4 μs positive bias |
| Substrate temperature | approx. 500° C. |
| Process duration | 10 min. |

For the transition, about 5 min. long, to the functional layer itself the aluminum arc sources were fed a DC source current of 60 A, with the positive pole of the DC source connected to the annular anode and frame ground. In addition there was a superposition with unipolar DC pulses of a second, parallel-connected power supply operated at 50 kHz. In the example described a symmetrical pulse/no pulse ratio was used, with a 10 μs pulse and a 10 μs interval, with currents of up to 150 A generated in the pulses. This was followed by introducing the oxygen at 300 ccm/s or with the parameters shown in FIG. 10.

After ramping up the Al targets and selecting the oxygen flow the source current on the Cr target was ramped down to zero within about 10 min. while at the same time the $N_2$ flow was reduced, followed by bringing the Ar flow to zero.

Coating the substrate with the actual functional layer took place in a pure reactive gas (in this case oxygen). Since aluminum oxide forms insulating layers, either a pulsed or an AC bias supply was used.

The essential parameters for the functional layer were selected as follows:

| | |
|---|---|
| Oxygen flow | 300 ccm/s |
| Process pressure | $9 \times 10^{-3}$ mbar |
| DC source current Al | 60 A |
| Pulsed source current Al | 150 A, 50 kHz, 10 μs pulse/10 μs interval |
| Substrate bias | remained at −40 V DC pulsed or AC (50-350 kHz in each case) |
| Substrate temperature | approx. 500° C. |
| Process duration | 60 to 120 min., some individual tests for 360 min. |

The coating can also be performed simultaneously with an ignited low-voltage arc, which produces higher reactivity. As another advantage of simultaneous operation of the low-voltage arc during the coating process the DC component of the sources can be reduced further, depending on the LVA current potential. The coating process thus performed is stable over several hours. The target is coated with a thin, smooth oxide layer. The arc is steadier than it would be when operated without the additional pulsed signal and is divided into multiple smaller sparks. Spattering is substantially reduced.

The arc sources employed for both the bonding layer and the functional layer were Balzers arc sources with targets 160 mm in diameter and 6 mm thick and operated with a standard MAG 6 magnetic system. However, a process of this type can essentially be run with any popular source for as long as a corresponding power supply is connected to it.

The process described above is the preferred version since it is not demanding in terms of the pulsed power supply. The DC supply provides the minimum or holding current for the arc while the pulsed high-current supply serves to avoid spattering.

FIG. 10 provides details of other examples of the deposition parameters for functional layers. Initially, essentially the same cleaning, heating and etching steps were performed and an intermediate layer of CrN and TiN, respectively, was deposited as in Example #1. This was followed by the application of the functional layers consisting of aluminum oxide, aluminum nitride, chromium oxide, chromium nitride, titanium oxide and titanium nitride as specified in FIG. 10.

For a comparison of the effect of the source voltage through the application of an insulating coat, the layer deposited in Examples 2 and 8 was pure metal. In the process it was found that a coating especially with highly insulating oxide layers leads to a steep rise of the DC component in the source voltage. In this case the relative voltage increase already with comparably small additions of an oxygen-containing gas amounts to between 20 and 50% of the value of the bare-metal source operated in a pure inert gas. In nitrogen operation as well the source voltage will rise, albeit at a lower rate of perhaps between about 10 and a maximum of 30%. While in all cases the simultaneous application of a pulsed voltage results in a minor drop of the DC source voltage as compared to pure DC operation, the originally lower voltage state of a bare-metal source will not ever be reached.

The preferred frequency range for operating the arc source is between 5 and 50 kHz. However, if necessary the source can also be operated at frequencies as low as about 0.5 kHz or as high as up to 1 MHz. At still lower frequencies the operation in the deposition of insulating layers becomes unstable, at higher frequencies the cost of the generator will rise to an extreme level.

If additional adaptive layers are desired or required, they can be applied either in lieu of the CrN or other bonding layer or between the bonding layer and the functional layer.

Examples thereof which, apart from those already mentioned, can also be helpful in the deposition of oxidic cover layers, include the oxycarbides of titanium and chromium as well as the oxynitrides, oxysilicides, oxysiliconitrides and siliconitrides of aluminum, chromium, titanium, niobium or zirconium.

Those skilled in the art know that bonding and adaptive layers produced by cathodic arc vaporization, while offering excellent bonding strength, can also be generated by other coating techniques such as CVD, PECVD, sputtering, or vaporization with a low-voltage arc from an anodic crucible. Essentially any combination of different techniques is possible, although plasma-supported processes that ensure high ionization are preferred for the higher bonding strength attainable with them.

BRIEF DESCRIPTION OF THE ILLUSTRATIONS

The following will explain this invention in more detail with the aid of figures which merely represent a few different implementation examples and in which.

Figure 1:
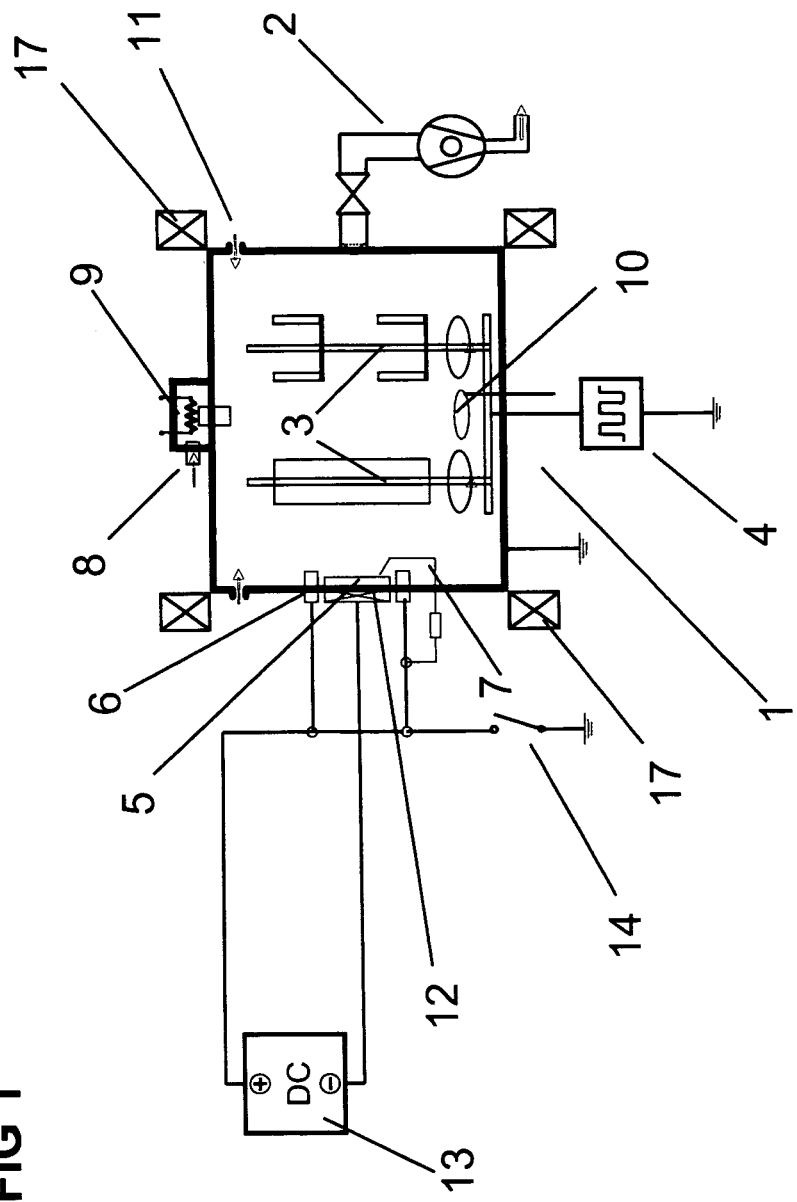
FIG. 1 depicts a vacuum processing system with an arc source.

The vacuum processing system 1, illustrated in FIG. 1 for comparison purposes, is a conventional assembly serving to drive an arc source with a DC power supply 13. The system 1 is equipped with a vacuum pump unit 2, substrate holders 3 that accept and establish electrical contact with work pieces, not shown, as well as a bias current supply 4 that applies a so-called substrate voltage to the work pieces and may be a DC, AC, bipolar or unipolar substrate voltage supply. By way of a process gas inlet 11 an inert or reactive gas can be introduced, serving to control the process pressure and gas composition in the processing chamber.

The arc source itself is composed of a target 5 and, behind it, a cooling plate 12, an ignition pin 7 as well as an anode 6 extending around the target. A switch 14 permits selection between a floating operation of the anode and positive pole of the power supply 13 and operation with a defined zero or ground potential.

Other optional features of the vacuum processing system 1 include an additional plasma source 9, in this case a source for generating an LVA with a hot cathode, with an inert-gas inlet 8, an auxiliary anode 10 and, not illustrated, another power supply for operating the low-voltage arc between the plasma source 9 and the auxiliary anode 10, plus, if needed, coils 17 for the magnetic focusing of the low-voltage arc plasma.

Figure 2:
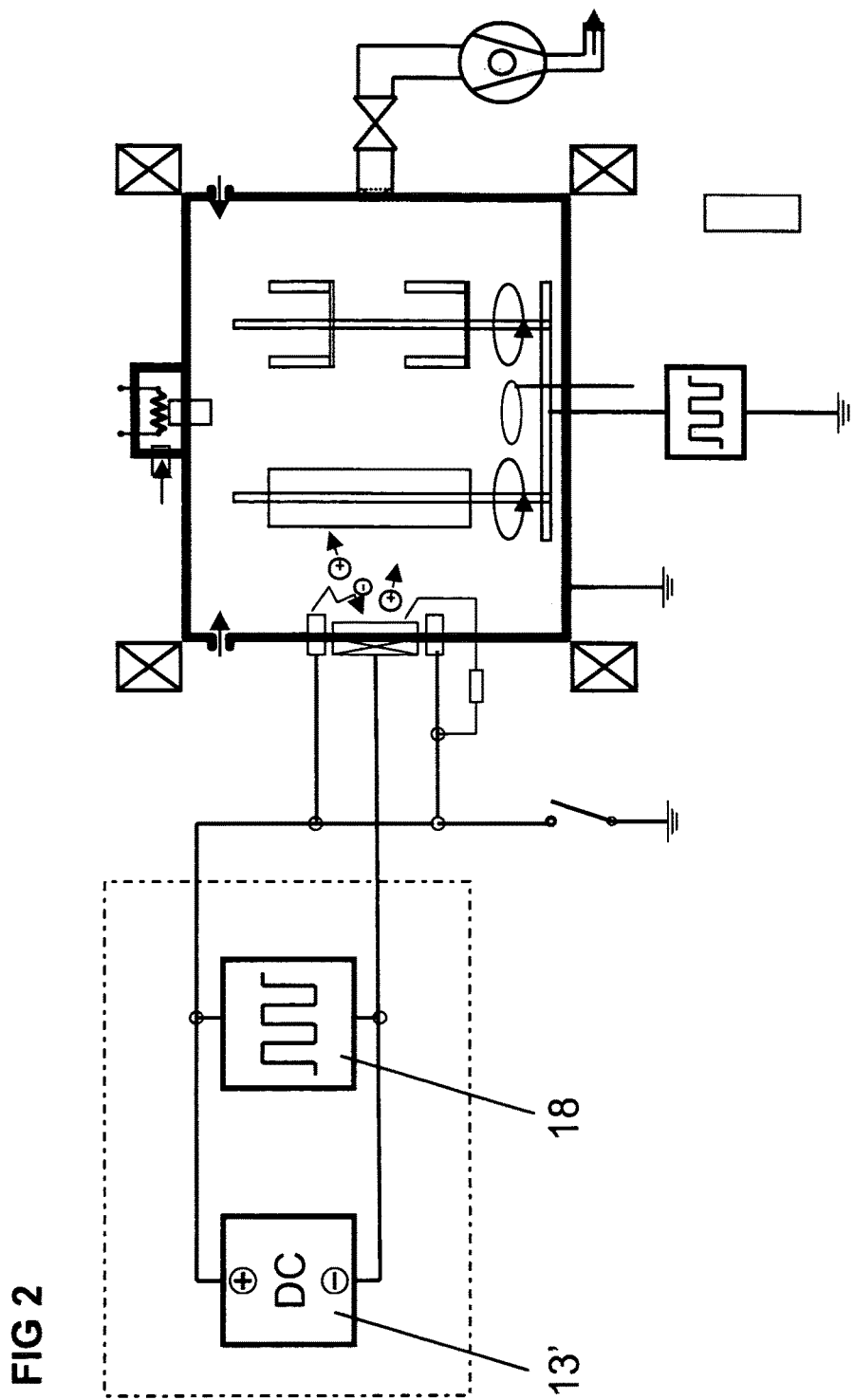
FIG. 2 shows a parallel-connected DC and pulsed power supply

FIG. 2 depicts an arc source that is operated with two parallel-connected power supplies, one being a DC power supply 13', the other a pulsed high-current power supply 18 for superpositioning a unipolar or bipolar pulsed signal on the direct current. This electrical configuration permits the stable operation of a reactive arc vaporization even for insulating layers whereby the interior of the system 1, the auxiliary anode 10 and the substrate holders 3 with the substrates are progressively coated with an insulating layer.

Figure 3:
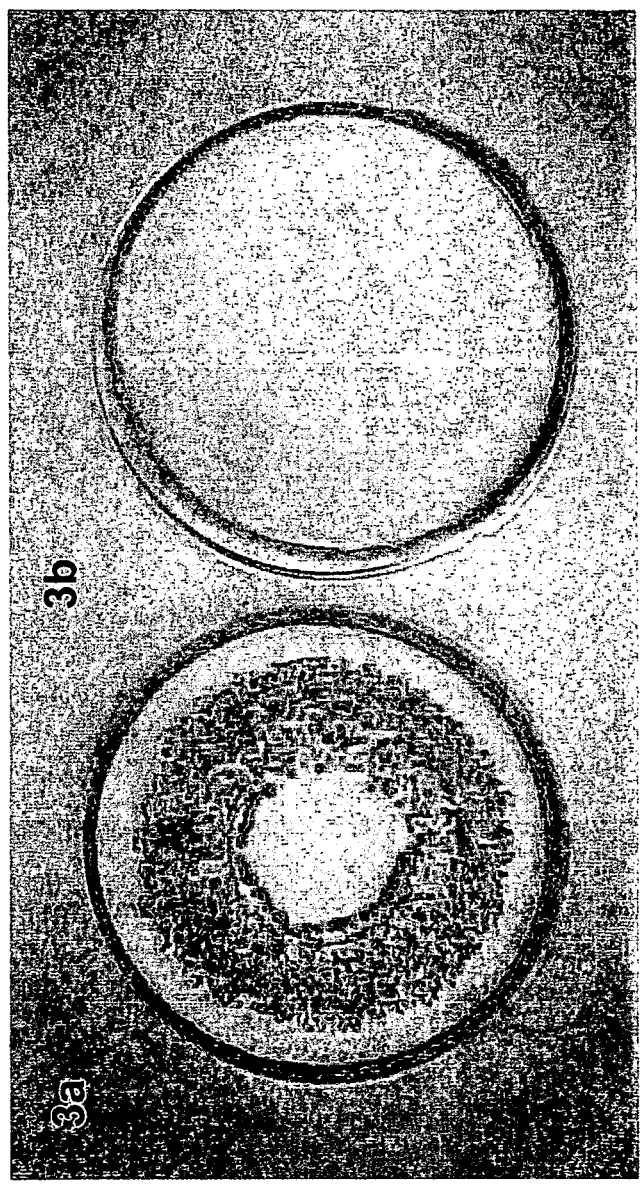
FIG. 3 shows target surfaces

If, by comparison, a target 5 consisting of pure aluminum is operated in an argon- and oxygen-containing atmosphere merely with a DC power supply 13 as in FIG. 1, the result after just a few minutes will be an unstable process which in the event of a strong oxygen flow will cause the process to abort. At the same time, islets of insulating material several millimeters in size, as shown in FIG. 3a, will form on the target 5. The layers deposited on the work piece surfaces will be quite rough and not completely insulating since there is obviously no continuous reaction of the many metal splashes. If on the other hand a target 5 is operated in an oxygenous atmosphere, with application of the method according to the invention as shown in FIG. 2, under otherwise identical conditions, the result will be a completely uniform insulating aluminum oxide surface as shown in FIG. 3b. The process can be run over several hours, interrupted, and resumed with a target thus contaminated. At the same time there will be substantially less spatter on the surface of the work piece.

Figure 4:
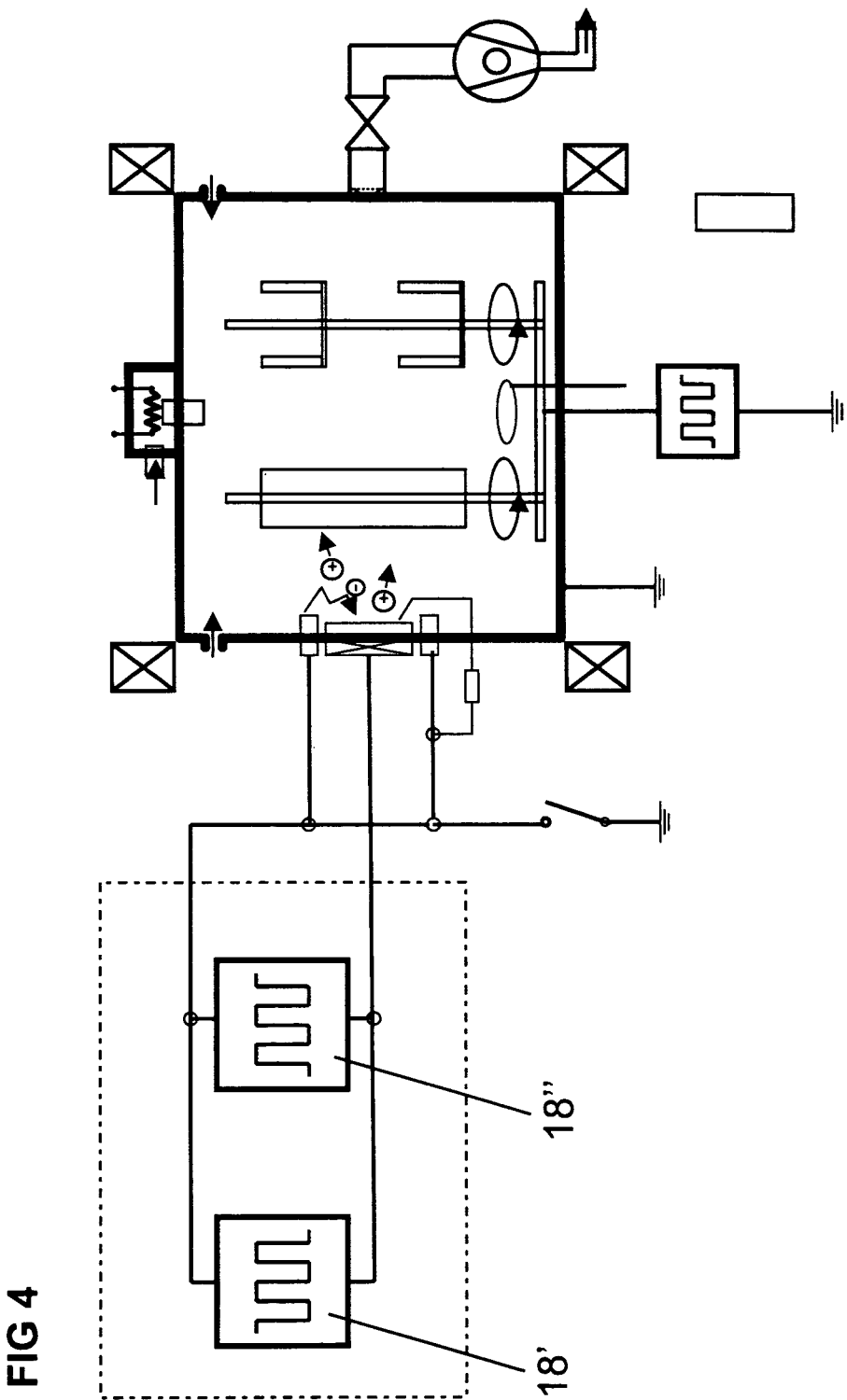
FIG. 4 illustrates two parallel-connected pulsed power supplies

Described below are other possibilities and configurations for the pulse-modulated operation of an arc source. FIG. 4 shows the parallel connection of two DC power supplies 18' and 18", preferably pulsed in synchronized fashion. This configuration offers a number of advantages for instance in unipolar operation. For example, in equal pulse-width operation the time interval between two pulses can be held very short, permitting a correspondingly large pulse-to-interval ratio and thus the setting of very short cycle times. The resulting possibility to limit the energy supply per pulse, for instance in adaptation to the specific target material, can very effectively prevent the spark from sticking and further reduce spattering. But in unipolar operation with varying pulse widths as well, with differing or identical frequencies, such operation allows for a particularly accurate selection of the individual cycle phases and thus for very good control of the deposition rate. In principle, pulsed DC power supplies may be replaced with less complex alternating-current power supplies, although it is more difficult with the latter to produce signals of a particular form and edge gradient.

Figure 5:
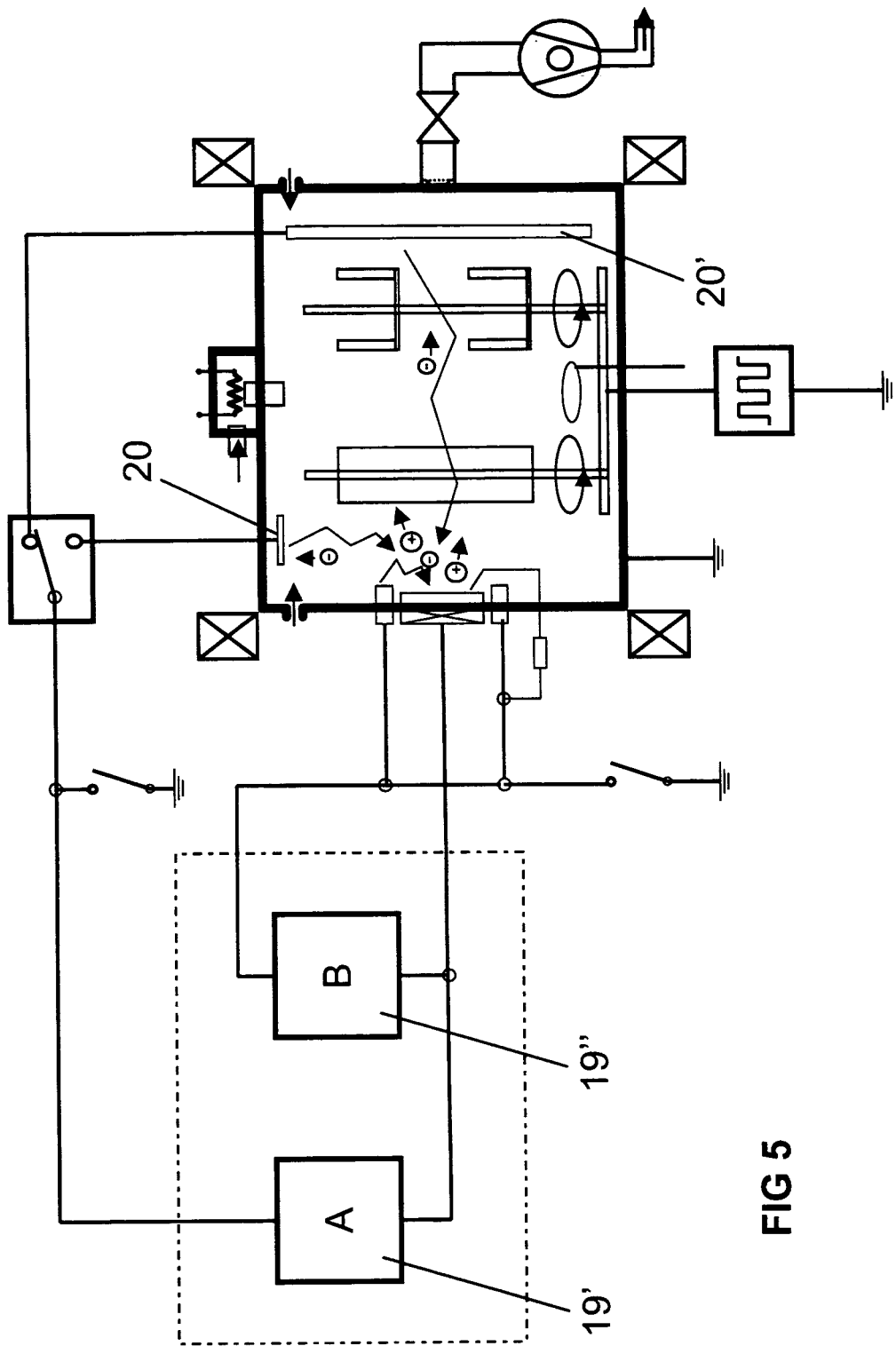
FIG. 5 depicts a multiple-anode array

As shown in FIG. 5, the concept of two power supplies 19, 19" also permits in very advantageous fashion the positioning of several anodes 20, 20' for a better distribution of the plasma in the coating chamber. The electrons are more easily guided for an augmented plasma density and process reactivity.

Figure 6:
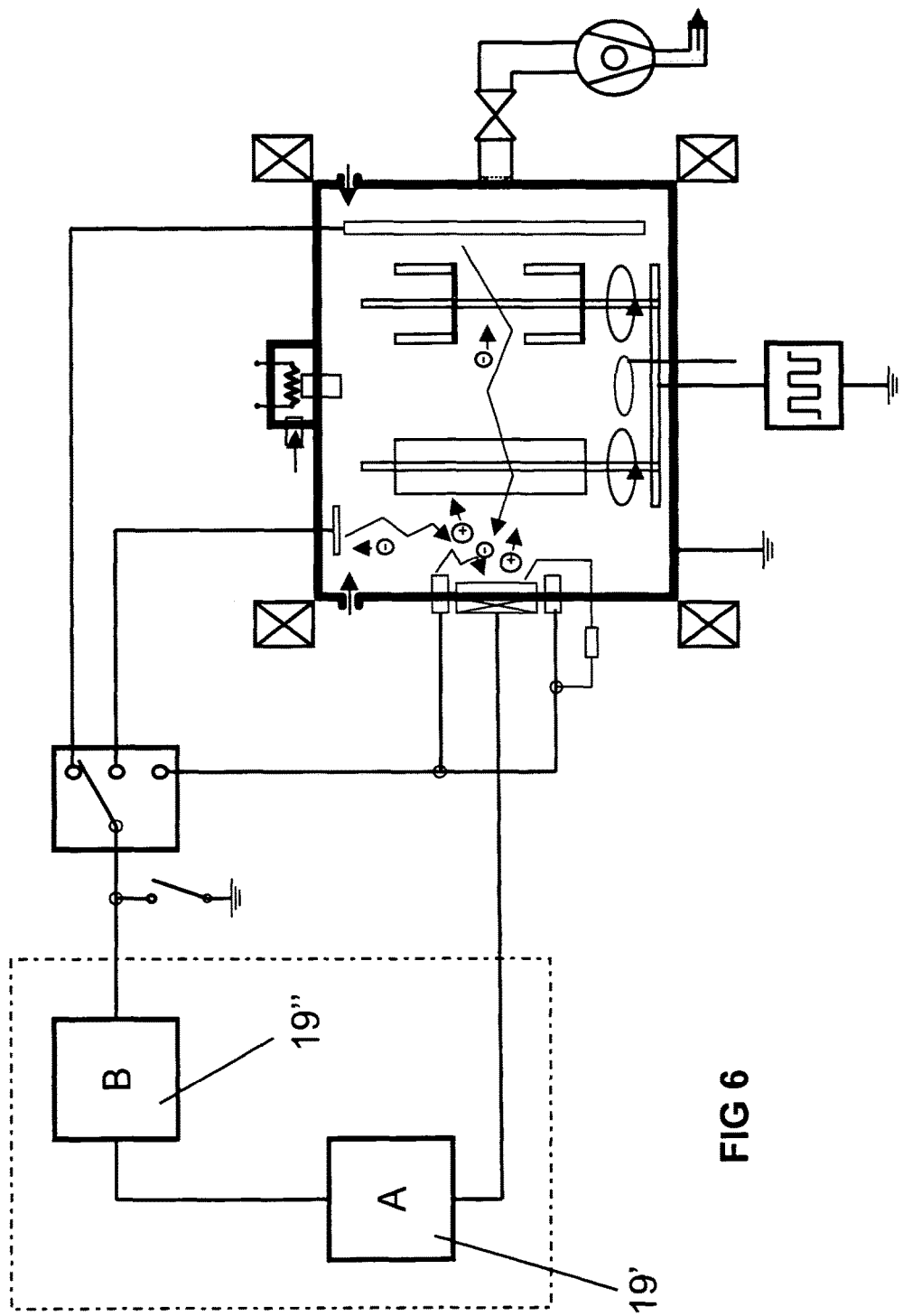
FIG. 6 shows power supplies connected in series

FIG. 6 shows an arc source fed by two series-connected power supplies 19', 19" at least one of which is a pulsed or AC power supply. This configuration permits particularly easy adaptation of the arc-source rate control.

Figure 7:
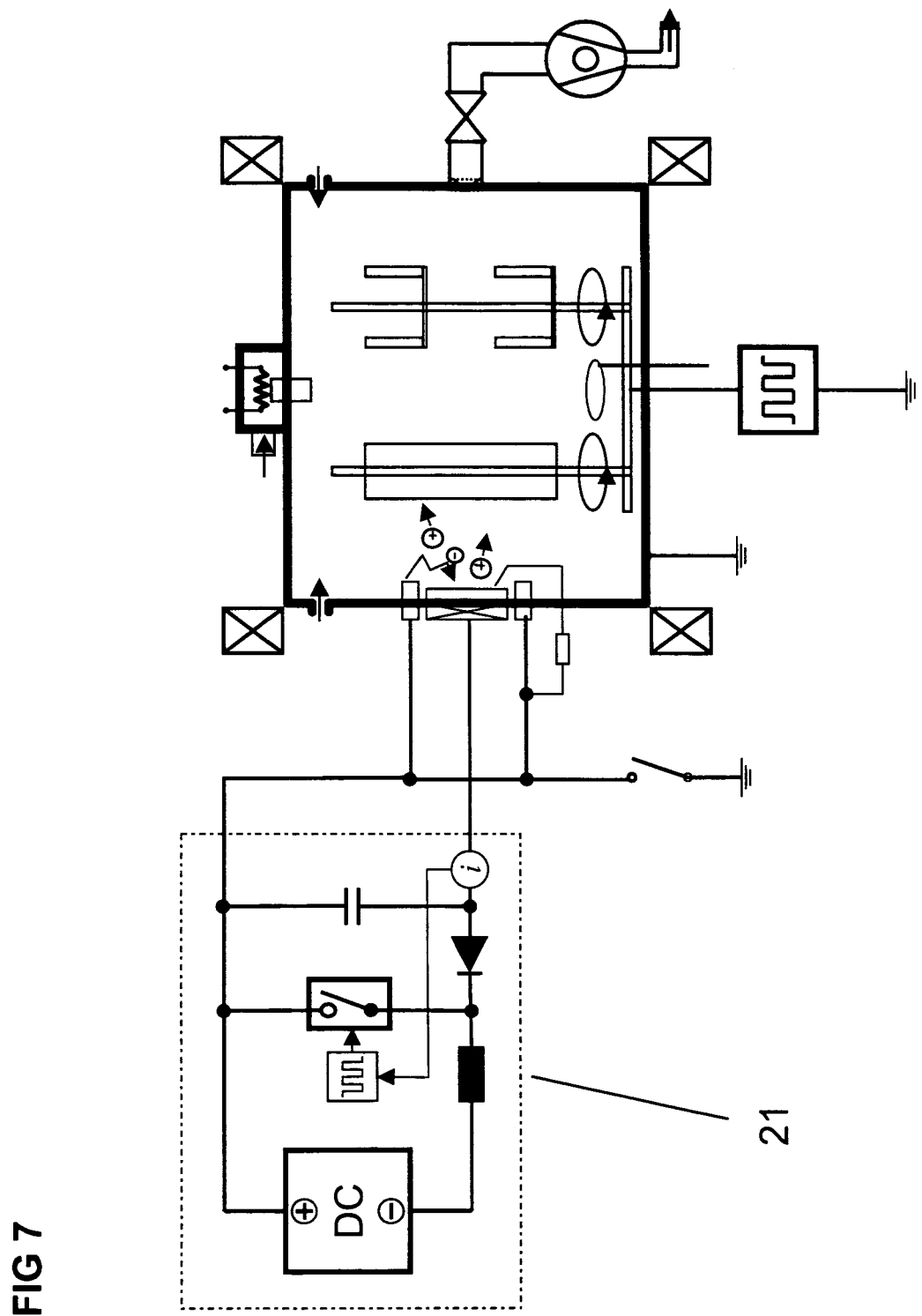
FIG. 7 shows power supplies connected back-to-back

The other design examples illustrate power supplies in which the pulsed current or the direct-current component is generated by switchable combinatorial circuitry. In power supplies of that type the ripple of the resulting DC signal, otherwise undesirable, can be amplified to a point where the output signal from the power supply is such as to meet the requirements described above. For example, as schematically illustrated in FIG. 7, a secondary, clocked power supply can serve as a step-up transformer 21 or, as shown in FIG. 8, again a secondary pulsed power supply can serve as a step-down transformer 21'. By contrast, FIG. 9 shows a primary clocked power supply 22 serving to generate the desired signal.

Figure 8:
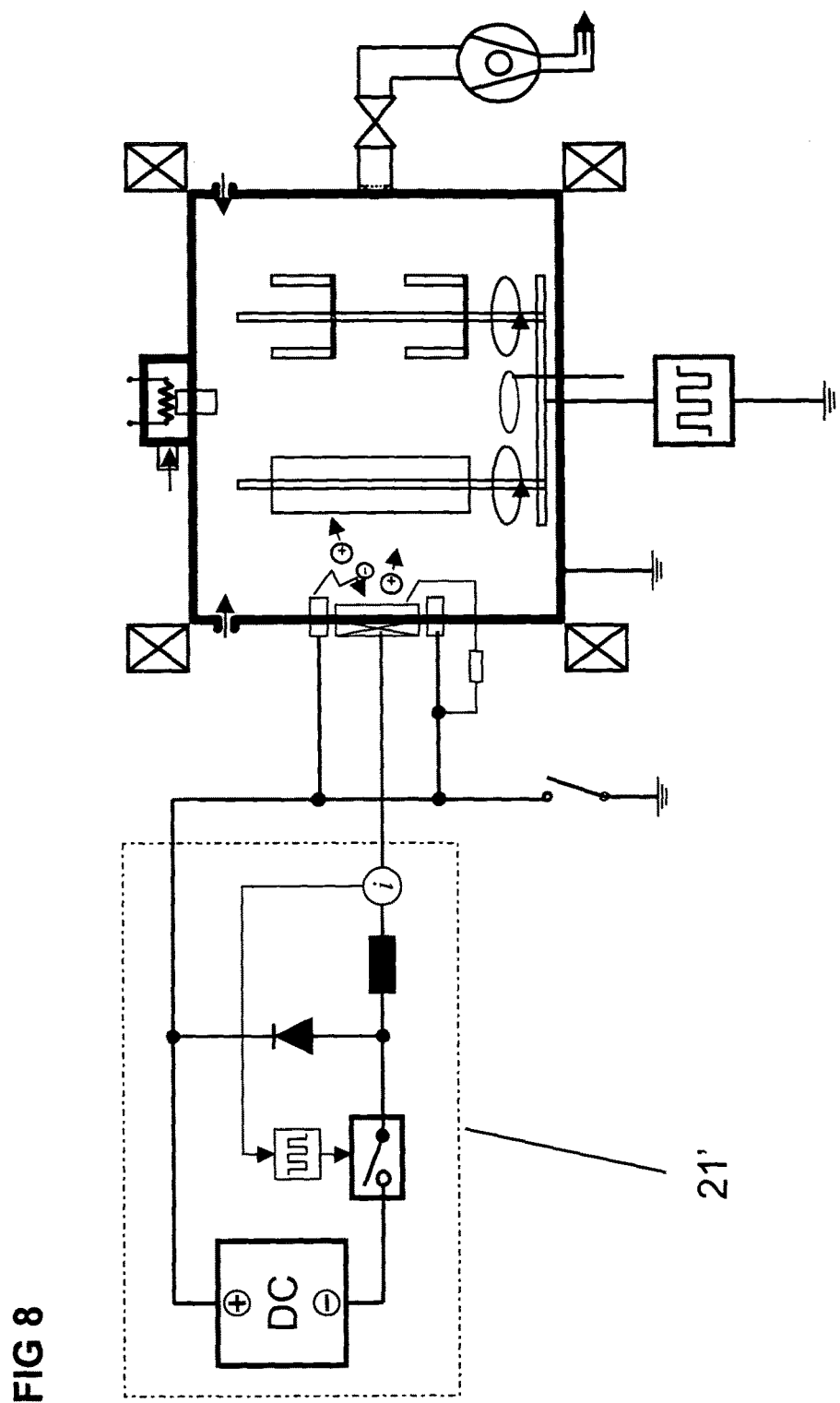
FIG. 8 represents a pulsed secondary power supply
Figure 9:
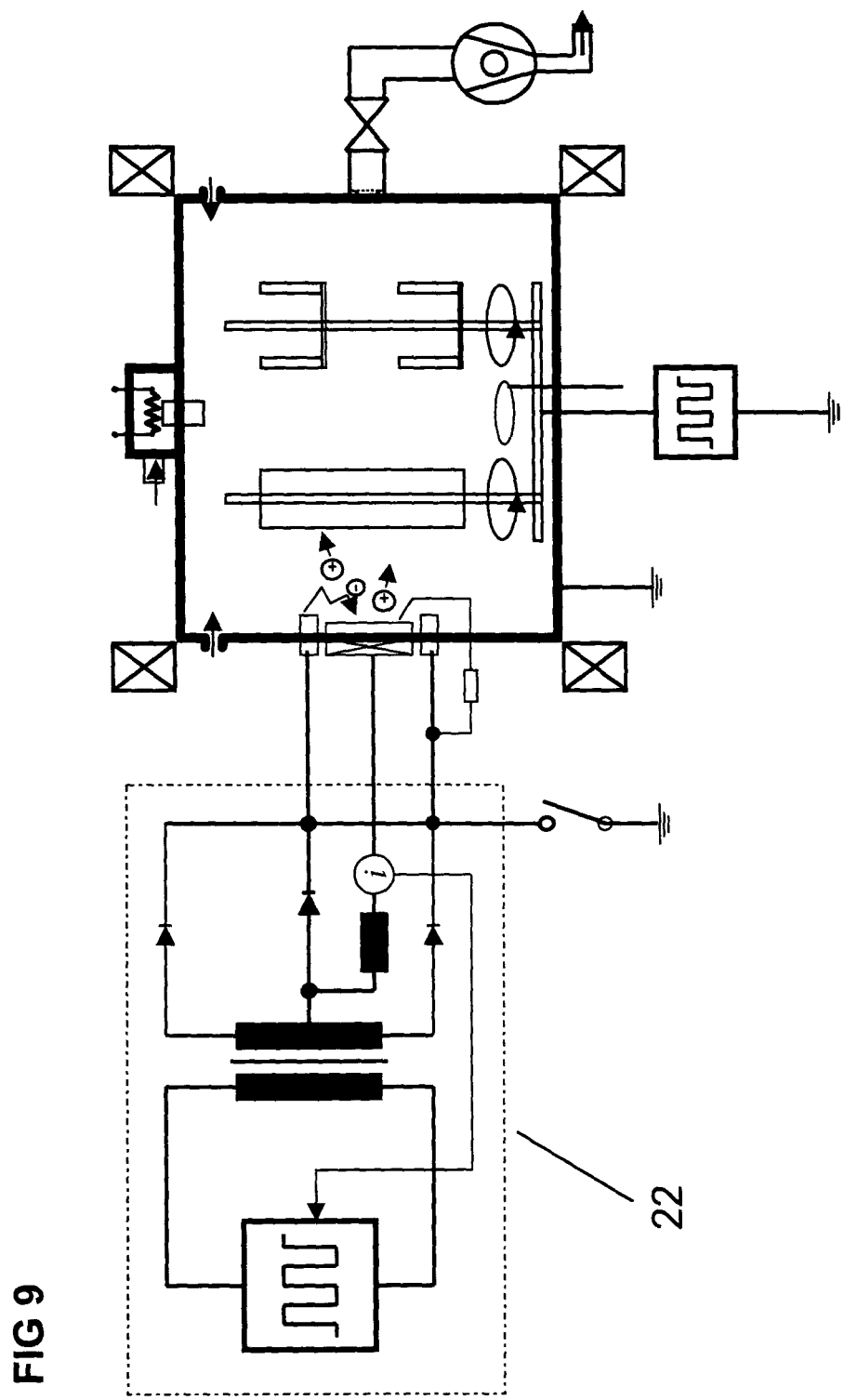
FIG. 9 represents a primary clocked power supply

Of all the power supplies with switchable combinatorial circuitry the unit shown in FIG. 8 is the technically easiest to produce and is therefore the preferred design in use.

REFERENCE NUMBERS

1 Vacuum processing system
2 Vacuum pump unit
3 Substrate holder
4 Bias current power supply
5 Target
6 Anode
7 Ignition pin
8 Inert-gas inlet
9 Plasma source
10 Auxiliary anode
11 Process gas inlet
12 Cooling plate
13, 13' DC power supply
14 Switch
17 Magnetic field coils
18, 18', 18" Pulsed power supply
19, 19', 19" Power supply
20, 20' Anode
21 Step-up transformer
21' Step-down transformer
22 Primary clocked power supply

The invention claimed is:

1. A process for producing insulating layers by means of arc vaporization deposition comprising the steps of:
   igniting an electric arc discharge for operating an arc vaporization source;
   applying the arc discharge to a surface of a target material that is operated as cathode during operation of the arc vaporization source in a reactive-gas-containing atmosphere, which comprises oxygen as reactive gas; and
   coating the surface of the target at least partially with an electrically insulating layer from the target material that is operated as cathode by simultaneously applying a direct current and a pulsed or alternating current, the direct current being superimposed by the pulsed or the alternating current,
   wherein the surface of the target coated in this manner is a result of the reactive gas and its reaction with the target surface,
   wherein a percentage of the reactive gas in the reactive-gas-containing atmosphere is at least 70%, and
   wherein the percentage of the reactive gas is selected to be so high during operation that it causes an increment of the direct current by at least 20% in comparison with operation without forming the electrically insulating layer.

2. The method of claim 1, wherein the reactive gas comprises at least one of the following components: nitrogen, acetylene, methane, silanes, trimethyl aluminum, borane, silicon, boron or carbon.

3. The method of claim 1, wherein the target is made of a material from at least one of the following: a transition metal of subgroup IV, V, VI, or aluminum, boron, carbon or silicon or an alloy or a compound of these materials.

4. The method of claim 3, wherein the electrically insulating layer consists of an oxide, nitride, boride, silicide, carbide of the target material or a mixture of said compounds of the target material.

5. The method of claim 1, wherein the DC component is in a range between 30 and 90 A.

6. The method of claim 1, wherein a reactive gas, an inert gas, or a combination of a reactive and an inert gas is metered and is introduced to the target.

7. The method of claim 1, wherein the target is made of a material comprising one single crystallographic phase.

8. The method of claim 1, wherein the direct-current is generated by a direct-current generator and the pulsed or alternating-current is generated by a pulsed or alternating-current generator, where both generators are connected either parallel or in series between an arc cathode and at least one anode or ground.

9. The method of claim 1, wherein the direct-current and the pulsed-current are generated by two pulsed or alternating-current generators operated in a superimposed and synchronized mode, where both generators are connected either parallel or in series between an arc cathode and at least one anode or ground.

10. The method of claim 1, wherein the direct-current and the pulsed-current components are generated by a secondary clocked current generator and wherein the secondary clocked current generator is connected either in parallel or in series between an arc cathode and at least one anode or ground.

11. The method of claim 1, wherein the direct-current and the pulsed-current are generated by a primary clocked current generator and wherein the primary clocked current generator is connected either parallel or in series between an arc cathode and at least one anode or ground.

12. The method of claim 1, wherein a work piece is coated with at least one layer.

13. The method of claim 12, wherein the layer comprises at least one of the following materials: a transition metal of subgroup IV, V or VI as well as aluminum and their compounds with oxygen, nitrogen, carbon, boron or silicon.

14. The method of claim 12, wherein the layer comprises at least of the following materials: aluminum oxide, aluminum nitride, aluminum oxinitride, chromium oxide, chromium nitride, chromium oxinitride, aluminum chromoxide, aluminum chromonitride, aluminum chromoxinitride, aluminum chromoxicarbonitride, silicon oxide, silicon nitride, silicon oxinitride, silicic aluminum oxide, silicic aluminum nitride, silicic aluminum oxinitride, titanous silicon nitride, titanous silicon oxinitride, tantalic silicon nitride, tantalum oxide, tantalum oxinitride, wolframic silicon nitride, wolframic silicon carbide, niobium silicon nitride, titanium carbide, tungsten carbide, or an alloy or compound of the above materials.

15. The method of claim 12, wherein a DC, pulsed or alternating-current bias is applied to the work piece.

16. The method of claim 12, wherein a pulsed or alternating-current bias is synchronized with the pulsed or alternating current is applied.

17. The method of claim 12 further comprising the steps of:
   adding, at least once, a first gas comprising one of an inert or a reactive gas at a first flow rate;
   metering the first gas;
   adding, at least once, a second gas comprising a reactive gas at a second flow rate; and,
   metering the second gas,
   wherein the addition of the first and the second gases changes a layer composition.

18. The method of claim 17, wherein the first flow rate is reduced before, during or after a setting of the second flow rate and that the second flow rate is adjusted from a lower value to a higher value or from a higher value to a lower value.

19. The method of claim 18, wherein a metering and adjustments of gas settings are performed along a ramped or stepped pattern so as to bring about an essentially continuous or stepwise change of the layer composition.

20. The method of claim 17, wherein by alternating an increase and a decrease of the first and second flow rates a multi-layered coat is deposited.

21. The method of claim 12, wherein several arc sources are simultaneously operated with identical or different target materials.

22. The method of claim 12, wherein a deposition rate or energy penetration into the work piece is set by adjusting at least one of the following parameters: a pulse width of the pulsed current, a height of the pulsed current or a pulse-width repetition rate.

23. The method of claim 12, wherein the work piece is a tool or a structural component.

24. The method of claim 12, wherein the work piece is comprised of silicon or some other semiconductor material.

25. The method of claim 1 further comprising the steps of: applying a DC, pulsed or alternating-current bias to a work piece; and, etching the work piece with metal ions.

26. The method of claim 25, wherein a DC bias current in the range of −50 and −2000 V is applied to the work piece.

27. The method of claim 26 further comprising a step of adding an etching gas.

28. The method of claim 27, wherein the etching gas is comprised of at least one of the following components: He, Ar, Kr, oxygen, nitrogen, hydrogen, a halogen or a halogenous compound.

29. The method of claim 3, wherein the target is made of an alloy or compound from at least one of the following: TiAl, CrAl, TiAlCr, TiSi, TaSi, CrSi, WC.

30. The method of claim 1, wherein the target is made of an alloy or compound from at least one of the following: TiAl, CrAl, TiAlCr, TiSi, TaSi, CrSi, WC.

31. The method of claim 1, wherein the target is made of aluminum.

32. The method of claim 1, wherein a percentage of the holding current corresponds to the DC component of the current flow in a range between 30 and 90 A.

33. The method of claim 1, wherein the reactive-gas-containing atmosphere consists of oxygen.

34. The method of claim 1, wherein the target material is one of aluminum, chromium, and titanium.

35. The method of claim 1, wherein the target material is a metallic target consisting of chromium with silicon or titanium with silicon.

36. The method of claim 35, wherein the target material has a silicon concentration of more than 50%.

* * * * *